United States Patent [19]
Aoki et al.

[11] Patent Number: 4,581,768
[45] Date of Patent: Apr. 8, 1986

[54] VHF TUNER

[75] Inventors: Kazuharu Aoki; Masahiko Saito, both of Soma, Japan

[73] Assignee: Alps Electric Co., Ltd., Japan

[21] Appl. No.: 605,595

[22] Filed: Apr. 30, 1984

[30] Foreign Application Priority Data

Apr. 28, 1983 [JP] Japan ............................. 58-64784[U]

[51] Int. Cl.⁴ ............................................. H04B 1/26
[52] U.S. Cl. .................................... 455/179; 455/190; 455/196; 455/319; 455/333; 334/15
[58] Field of Search ............... 455/179, 188, 190, 196, 455/318, 319, 333, 180, 195, 197; 334/15; 331/109, 177 V

[56] References Cited

U.S. PATENT DOCUMENTS

| | | | |
|---|---|---|---|
| 3,611,154 | 10/1971 | Kupfer | 334/15 |
| 3,813,615 | 5/1974 | Okazaki | 455/318 |
| 3,825,858 | 7/1974 | Amemiya et al. | 455/318 |
| 3,866,138 | 2/1975 | Putzer | |
| 3,889,210 | 6/1975 | Matsuura et al. | 455/318 |
| 4,380,827 | 4/1983 | Moon | 455/318 |

FOREIGN PATENT DOCUMENTS

| | | | |
|---|---|---|---|
| 3144242 | 5/1983 | Fed. Rep. of Germany | 455/318 |
| 131718 | 11/1978 | Japan | 455/188 |

Primary Examiner—Jin F. Ng
Attorney, Agent, or Firm—Guy W. Shoup

[57] ABSTRACT

In a VHF tuner, feedback capacitance between the emitter of a local oscillating transistor and the ground in a local oscillator is changed at the low band receiving state and high band receiving state by controlling a switching diode connected in series to a capacitor for feedback capacitance and, a mixer is installed to mix the output of the local oscillator and high frequency input. For an improved mixer biasing circuit, the switching diode in series connection to the capacitor for feedback capacitance is connected to one terminal of a mixing FET in the mixer, and changing of the feedback capacitance in the local oscillator is accompanied by changing of working current of the mixing FET in the local oscillator.

2 Claims, 2 Drawing Figures

VHF TUNER

BACKGROUND OF THE INVENTION

1. Field of the Invention

The present invention relates to VHF tuners, and more particularly to a VHF tuner to change feedback capacitance of a local oscillator at low band receiving state and high band receiving state, in which a switching diode in series connection to a capacitor for feedback capacitance is connected to one terminal of a mixing FET in a mixer so that working current of the mixing FET is changed corresponding to changing of the feedback capacitance.

2. Description of the Prior Art

In VHF tuners in general, feedback capacitance between emitter of a local oscillating transistor and the ground (hereinafter referred to as "feedback capacitance") in a local oscillator is changed corresponding to low band receiving state and high band receiving state in VHF region. Referring to FIG. 1, changing of the feedback capacitance in a conventional VHF tuner is performed in that a local oscillating transistor 1 has parallel connection of capacitors 2 and 3 between emitter thereof and the ground, and a switching diode 4 is connected in series to the capacitor 3 and turned on or off by control voltage applied to a switching control terminal 5. That is, the switching diode 4 is turned on at low band receiving state; it is turned off at high band receiving state. As a result, the feedback capacitance at low band receiving state becomes composite capacitance of the capacitors 2 and 3 since the capacitor 3 is grounded through the switching diode 4. On the contrary, the feedback capacitance at high band receiving state becomes capacitance value of only the capacitor 2 since the switching diode 4 is turned off. Output of the local oscillating transistor 1 is generated on changing the feedback capacitance in above-mentioned manner and then transmitted through a capacitor 6 to a mixing FET 7. The mixing FET 7 performs mixing process with high frequency signal entered from a high frequency input terminal 8, and intermediate frequency signal is outputted through an intermediate frequency output terminal 9. Furthermore, reference numeral 10 in FIG. 1 designates a resonance circuit connecting terminal, numeral 11 a local oscillation voltage source terminal, numeral 12 a mixer voltage source terminal, numeral 13 a choking coil, numerals 14–23 resistors, and numerals 24–27 capacitors.

In the example of prior art described referring to FIG. 1, the feedback capacitance is changed at low band receiving state and high band receiving state, thereby oscillation frequency of the local oscillator can be changed corresponding to both bands. Since the switching diode 4 to change the feedback capacitance is grounded directly, in order to turn the switching diode 4 off, negative potential must be applied to the switching control terminal 5 or otherwise a prescribed reverse bias circuit must be installed without grounding the diode 4 directly. Although it is preferable that bias of the mixer be changed corresponding to low band receiving state and high band receiving state so as to prevent distorsion from occurring in the mixer during mixing process, bias of the mixer is fixed in the example of prior art shown in FIG. 1.

SUMMARY OF THE INVENTION

In order to eliminate the above-mentioned diasdvantages of the prior art, an object of the present invention is to provide a VHF tuner in which on-off control of a switching diode to change feedback capacitance is facilitated by simple constitution that the switching diode is not directly grounded but connected to one terminal of a mixing FET.

Another object of the invention is to provide a VHF tuner in which feedback capacitance is changed at low band receiving state and high band receiving state and also bias of a mixer is changed thereby conversion gain of required amount is obtained and distorsion is prevented from occurring in the mixer.

DETAILED DESCRIPTION OF THE INVENTION

Figure 1:
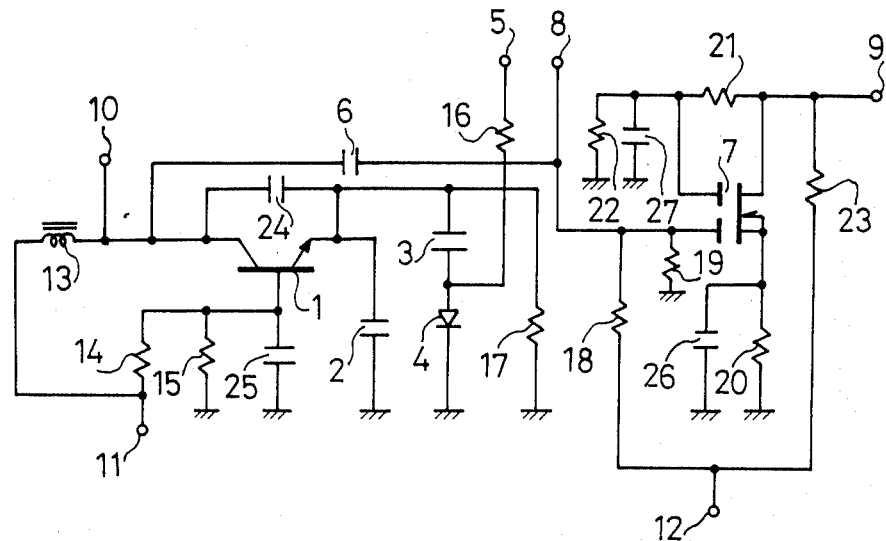
FIG. 1 is a circuit diagram of a VHF tuner in the prior art illustrating constitution of a local oscillator and a mixer.

An embodiment of the invention will now be described referring to FIG. 2. Reference numerals in FIG. 2 correspond to those in FIG. 1, respectively.

Figure 2:
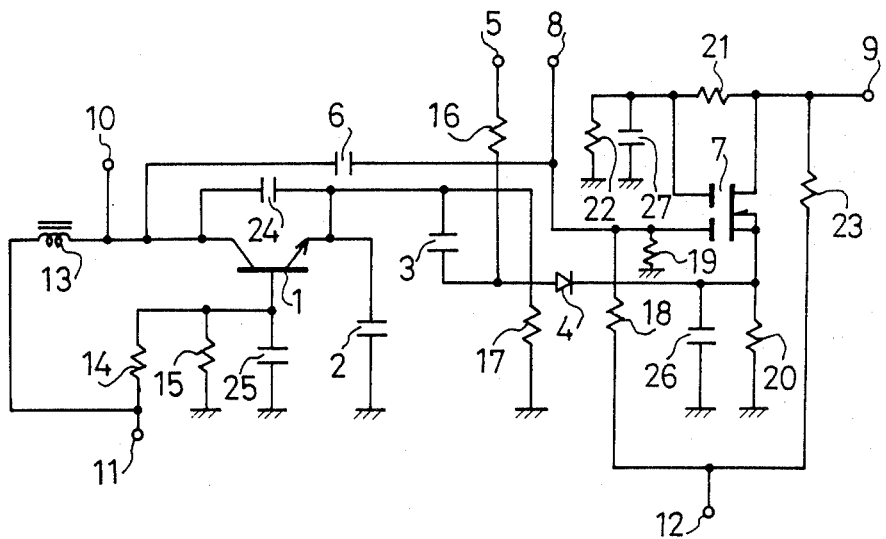
FIG. 2 is a circuit diagram of a VHF tuner as an embodiment of the invention illustrating constitution of a local oscillator and a mixer.

Example of the prior art shown in FIG. 1 and an embodiment of the invention shown in FIG. 2 are identical in the circuit constitution except that the switching diode 4 is directly grounded in the prior art but it is connected to source of a mixing FET 7 in an embodiment of the invention. Also in FIG. 2, on-off control of the switching diode 4 is performed by control voltage applied to a switching control terminal 5 thereby feedback capacitance is changed at low band receiving state and high band receiving state. This feedback capacitance changing operation in FIG. 2 is the same in principle as that in FIG. 1. In FIG. 2, however, since the switching diode 4 is connected to source of the mixing FET, bias of the mixer can be changed when the switching diode 4 is on, i.e. at low band receiving state and when the diode 4 is off, i.e. at high band receiving state. In other words, voltage between second gate (input gate) and source of the mixing FET 7 becomes smaller at high band receiving state when the switching diode 4 is on than that at low band receiving state when the switching diode is off. Because voltage is applied through the switching diode 4 to source of the mixing FET 7 if the diode 4 is on. Accordingly, conversion gain in the mixer can be reduced at low band receiving state in comparison to high band receiving state.

As above described, according to the present invention, conversion gain of the mixer at low band receiving state can be reduced to a suitable value thereby AGC control in a high frequency amplifier at initial stage of the tuner may be decreased and S/N ratio in low band receiving state is improved, while at high band receiving state the conversion gain can be elevated to a suitable value thereby AGC control in the high frequency amplifier acts to suppress input level to the mixer and distorsion occurring in the mixer is prevented to the utmost.

What is claimed is:

1. In a VHF tuner of the type having a local oscillator circuit having a local oscillating transistor wherein a capacitor and a switching diode are connected in series to an emitter of said oscillating transistor to provide feedback capacitance to change the oscillator circuit between a low band and a high band receiving state depending upon the switching state of said diode, and end of said diode being connected to a switching control terminal for switching the state of said diode by an applied voltage, and an output electrode of said oscillating transistor being connected to a gate electrode of a mixer transistor of an accompanying VHF mixer circuit for mixing the output of the oscillator circuit with a high frequency input, said mixer transistor having a high frequency input terminal connected to its gate electrode and an intermediate frequency output terminal connected to its output electrode, the improvement wherein said switching diode is connected to a source electrode of said mixer transistor, such that a working current of said mixer transistor is changed in accordance with the switching state of said diode, in order to provide improved conversion gain and signal-to-noise characteristics.

2. The VHF tuner of claim 1, wherein said switching diode is turned off and the source electrode fo the mixer transistor becomes substantially grounded during the high band receiving state.

* * * * *